United States Patent [19]

Mitchell et al.

[11] Patent Number: 5,309,132
[45] Date of Patent: May 3, 1994

[54] TECHNIQUE FOR TRIMMING PHOTORESISTORS AND TRIMMED PHOTORESISTORS

[75] Inventors: Nathan A. Mitchell; Philip J. McKenzie, both of Houston, Tex.

[73] Assignee: Compaq Computer Corporation, Houston, Tex.

[21] Appl. No.: 41,551

[22] Filed: Apr. 2, 1993

[51] Int. Cl.$^5$ .............................. H01L 31/08
[52] U.S. Cl. .................................... 338/15
[58] Field of Search ............ 338/15, 16, 17, 18

[56] References Cited

U.S. PATENT DOCUMENTS

| | | | |
|---|---|---|---|
| 4,307,372 | 12/1981 | Matsui et al. | 338/15 |
| 5,192,631 | 3/1993 | Inoue et al. | 338/15 X |

*Primary Examiner*—Marvin M. Lateef
*Attorney, Agent, or Firm*—Pravel, Hewitt, Kimball & Krieger

[57] ABSTRACT

A technique for trimming photoresistors to change relatively high tolerance parts to relatively low tolerance parts by blocking out a portion of the photoactive area, and the so-trimmed photoresistors. The blocking out can be performed by placing ink over the photoactive area. This ink placement step can be easily added in the photoresistor assembly line after the initial calibration location.

14 Claims, 1 Drawing Sheet

TECHNIQUE FOR TRIMMING PHOTORESISTORS AND TRIMMED PHOTORESISTORS

FIELD OF INVENTION

This invention relates to a technique for trimming photoresistors to change relatively high tolerance parts to relatively low tolerance parts, and relates to the trimmed photoresistors.

BACKGROUND OF THE INVENTION

Common and relatively inexpensive photoresistors, such as of the cadmium sulfide variety, are generally comprised of a photoresistive material sprayed over a plastic substrate. Leads are brought through the plastic material and terminate on a plated electrode layer which lies on top of the resistive material. An epoxy coating typically covers the photo-active area of the device.

In such a common design, lead to lead resistance is a function of the sheet resistivity of the photoresistive layer, the geometry of the electrode layer, and the amount of light landing on the photoactive area of the device.

While such common photoresistors enjoy a distinct price advantage, the variance in measurements from one photoresistor to the other can be significant. Plus or minus fifty percent tolerance parts are standard. Thus, the resistance measured upon exposure to a calibrated light level and color temperature may vary dramatically from part to part. This may prove unsatisfactory for certain potential uses for the parts. For instance, a light feedback system for notebook computers comprises one possible use for a photoresistor. In this use a 50% tolerance of parts is not acceptable.

This invention discloses a technique for reducing significantly the effective parts tolerance of common, relatively inexpensive photoresistors. The invention teaches trimmed photoresistors and a trim technique. Reduction of effective parts tolerance from an untrimmed plus or minus fifty percent to a trimmed plus or minus one percent has been experienced.

SUMMARY OF THE INVENTION

The invention teaches a technique for trimming photoresistors. Such trimming can reduce a parts tolerance that is unacceptably high for a particular intended use to a tighter, more acceptable effective tolerance. The technique includes determining a target resistance measurement from a plurality of photoresistor parts when they are exposed to a calibrated level and color temperature of light. Given the target measurement, the invention teaches "blocking out" portions of a photo-active area of each of a plurality of photoresistors so that the trimmed photoresistors measure the target resistance within a target tolerance when the photoresistors are exposed to the calibrated level and color temperature of light. The target tolerance is selected to yield an acceptable overall effective parts tolerance after trimming, and it will be less than the parts tolerance for the photoresistors untrimmed. A target tolerance of less than one half, or less than one tenth, of the untrimmed parts tolerance may be practicable.

Preferably, "blocking out" portions of a photoactive area comprises overlaying the photo-active area with a light inhibiting substance, such as ink. The overlaying with ink may comprise placing lines of ink across the photo-active area, such as by spraying, rolling, stamping, drawing or other means known in the art. One skilled in the art could devise alternate techniques for "blocking out" portions of a photo active area. The end result is the important point, that is, affecting and lessening the transmissivity of the device. For instance, the transmissivity of existing surfaces of a device might be modified by scratching or etching an epoxy coating, or the transmissivity of the epoxy itself might be modified through treatment with electromagnetic radiation. Techniques to affect transmissivity might target particular wavelengths known to be especially effective for a given photoresistor. Thus, a modification technique might modify only a subset of all wave lengths in order to affect the transmissivity. More simply and easily, the transmissivity can be affected by overlaying an existing device with a substance that blocks out some or all impinging light wavelengths. Covering portions of the surface of a cadmium sulfide photoresistor with ink from a felt tip pen has been demonstrated to be effective. Given the desired end result, those skilled in the art may call upon any number of known ways to achieve the objective.

The invention also discloses the trimmed photoresistors. The trimmed photoresistors comprise a plurality of photoresistors which are trimmed by having a portion of their photo-active area blocked out. In preferred embodiments, the blocking out includes overlaying a portion of a photo-active area with a light inhibiting substance. Ink comprises one such light inhibiting substance. The overlaying may be accomplished by placing lines of ink across the photoactive area. The amount of light blocked out from the photo-active area of each photoresistor is selected to yield a target resistance measurement within a target tolerance when the photoresistor is exposed to a calibrated level and color temperature of light. The target tolerance is selected to yield an acceptable effective trimmed parts tolerance, and it will be less than the parts tolerance of the photoresistors if, or when, untrimmed. The target tolerance may be less than one half or less than one tenth of the untrimmed parts tolerance.

As a practical matter, the trim target should be based on the upper resistance measurement region of the majority of tested untrimmed parts, since the parts may only be trimmed up.

One benefit of the photoresistor trimming technique is that it converts common less expensive but large tolerance photoresistors into tight tolerance parts. Since production of these parts typically entails exposure to a calibrated light source and color temperature while measuring lead to lead resistance, the inclusion of a trimming step in production is efficient and can result in providing tight tolerance parts in mass quantities. Since during production a light source, ohmmeter, computer and part feeders should already be deployed, the invention can be accomplished by adding an ink applicator, or similar light transmissivity affecting equipment, to an existing process.

Providing tight tolerance parts has the advantage of enabling end users, such as in notebook computers, to avoid having to make certain adjustments to their circuits, and possibly thereby to reduce circuit costs, without significantly increasing the cost of the parts.

As an incidental advantage, higher batch yields of photoresistors may be achieved by the manufacturer through the photoresistor trim technique, since parts normally out of specification may be brought into specification by the trimming technique.

BRIEF DESCRIPTION OF THE DRAWINGS

A better understanding of the present invention can be obtained when the following detailed description of the preferred embodiment is considered in conjunction with the following drawings, in which.

DESCRIPTION OF THE PREFERRED EMBODIMENT

Figure 1:
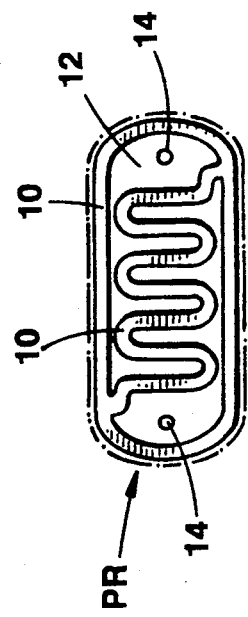
FIG. 1 illustrates the typical construction of the face of a photoresistor, such a cadmium sulphide photoresistor.
Figure 2:
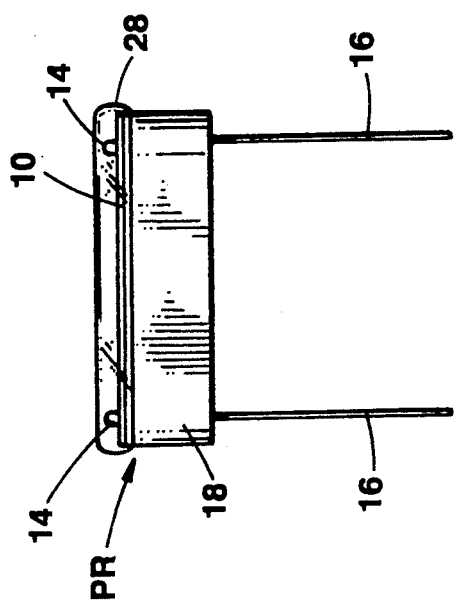
FIG. 2 illustrates a side view of a typical photoresistor, such as a cadmium sulphide part.

FIG. 1 illustrates the face of a typical photoresistor PR, such as a cadmium sulphide part. Substance 10 comprises photoresistive material. Photoresistive material 10 is typically sprayed over a plastic substrate, as illustrated in FIG. 2. Substance 12 indicates a plated electrode layer which lays on top of the photoresistive material 10. Elements 14 indicate lead terminals. Leads 16, as illustrated in FIG. 2, are brought through plastic substrate 18 and terminate in lead terminals 14. The geometry of the plated electrode layer, including the width of the channel between electrodes and the length of the channel between electrodes, is one factor that affects lead to lead resistance of the photoresistor PR of FIGS. 1 and 2. Sheet resistivity of photoresistive layer 10 also affects lead to lead resistance, as does the amount of light landing on the face or photo-active area of the photoresistor PR device.

Figure 3:
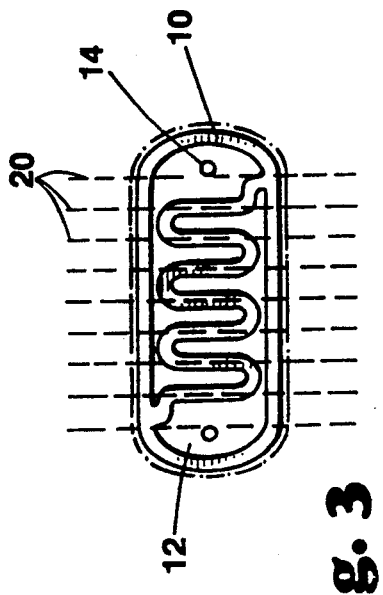
FIG. 3 illustrates the face of FIG. 1 showing ink lines placed across the face of the part.

FIG. 3 illustrates ink lines 20 placed across the face of photoresistor PR. Ink lines 20 help control the amount of light landing on the photo-active area of the device. Ink could be placed on the face of the device by marking, spraying, rolling, stamping, drawing or by any number of other known methods in the art. A ink jet sprayer might be utilized as an effective assembly line technique. Ink sprayers comprise common and effective equipment known in the art to precisely apply ink lines, such as manufacturers names on circuit boards and the like. Typically an epoxy coating 28 covers the photo-active area of the device. Such epoxy coating 28 is illustrated in exaggerated form in FIG. 2. Ink lines 20 block out portions of the photo-active area of photoresistor PR. Alternate means of blocking out portions of a photoactive area of photoresistor PR are known to those skilled in the art. For instance, epoxy coating 28 might be scratched or etched to adversely affect the transmissivity of the face of photoresistor PR. The transmissivity of the epoxy itself might be modified through application of electromagnetic radiation to coating 28. Alternate techniques to affect the transmissivity of a photo-active area of the face of photoresistor PR might target, in fact, particular wavelengths of light known to be especially effective for the photoresistor PR. Thus, a suitable modification technique might particularly modify the transmissivity for a subset of wavelengths.

Figure 4:
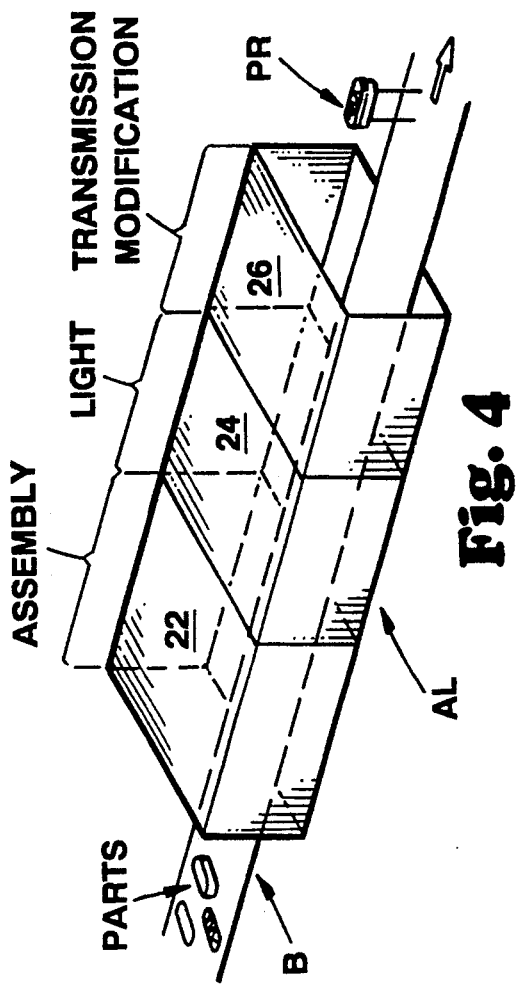
FIG. 4 illustrates an assembly line for a photoresistor including additions to practice the present invention.

In the trimming technique of the present invention parts P, suitable to form a photoresistor PR, are input into general assembly area AL, as illustrated in FIG. 4. Box 22 indicates the initial assembly area of the production line. Box 24 indicates an area of the assembly line where a fabricated photo-active area of a photoresistor PR is subjected to a calibrated light level and color temperature. Box 26 illustrates a modification of a typical production line for photoresistors PR in accordance with the present invention. Box 26 indicates an area in which the transmissivity of a fabricated photoresistor is modified in accordance with the teachings of this invention. Box 24 contains a source capable of exposing a photoresistor PR under construction to a calibrated light level and color temperature. Prior experimentation with untrimmed photoresistors has yielded a good estimate of the upper resistance region for the majority of untrimmed parts when exposed to the calibrated light. Since the resistance of the photoresistor decreases with exposure to light, the upper resistance region comprises the resistance readings of the parts that are showing the least sensitivity to light. Parts with greater sensitivity at this light level can have a portion of their photoactive area blocked out so that they too, upon exposure to the calibrated light, yield a resistance measurement located in the upper region, preferably within a target tolerance of a target resistance measurement. Experimentation with blocking out a portion of a photoactive area of a photoresistor with a felt tip pen has demonstrated at least one effective means for raising a resistance measurement of a part to such upper region.

Assuming, in the photoresistors which form the parts of interest in the instant application, that the resistive measurement registered when exposed to a calibrated light level and color temperature has shown significant variation, which may indicate an unacceptable parts tolerance, the region of the high resistance readings is noted. A target resistance measurement is selected in that upper resistance region. A target tolerance is selected that will yield an effective overall trimmed parts tolerance, taking into account the intended use for photoresistor PR. This target tolerance will be less than the untrimmed parts tolerance. Photoresistor PR, under construction according to the present trimming technique, will have its lead to lead resistance measured when subjected to the calibrated light and color temperature level. A portion of the photo-active surface of the photoresistor will then be modified, such as by the addition of ink lines across the face of the photoresistor, until its lead to lead resistivity measurement rises to within the target tolerance of the preselected target resistance measurement. The target tolerance, in practice, may be less than one half, or less than one tenth, of the untrimmed parts tolerance.

As discussed above, any one of a number of means known to one of skill in the art can be utilized to modify the transmissivity of a typical photoresistor. The utilization of ink jet spraying equipment might be the most effective in the assembly line method. Rolling, stamping or drawing could also achieve the desired result.

The foregoing disclosure and description of the invention are illustrative and explanatory thereof. Various changes in the size, shape and materials as well as the details of the illustrated construction may be made without departing from the spirit of the invention.

What is claimed is:

1. A technique for trimming photoresistors comprising:

determining a target resistance by exposing a plurality of photoresistors to a calibrated level and color temperature of light; and blocking out a portion of a photo-active area of each of a plurality of photoresistors so that each trimmed photoresistor has a measured resistance within a predetermined tolerance of the target resistance when exposed to the calibrated level and color temperature of light, the predetermined tolerance being less than an untrimmed parts tolerance.

2. The technique of claim 1 wherein blocking out comprises overlaying the photo-active area with a light inhibiting substance.

3. The technique of claim 2 wherein the light inhibiting substance comprises ink.

4. The technique of claim 3 wherein overlaying with ink comprises placing lines of ink across the photo-active area.

5. The technique of claim 3 wherein overlaying with ink comprises spraying ink across portions of the photo-active area.

6. The technique of claim 1 wherein the predetermined tolerance is less than one half of the untrimmed parts tolerance for the photoresistors.

7. The technique of claim 1 wherein the predetermined tolerance is less than one tenth of the untrimmed parts tolerance for the photoresistors.

8. Trimmed photoresistors comprising:
a plurality of photoresistors, each photoresistor having a portion of its photo-active area blocked out such that each photoresistor measures a resistance within a predetermined tolerance of a target resistance when each photoresistor is exposed to a calibrated level and color temperature of light, the predetermined tolerance being less than an untrimmed parts tolerance.

9. The trimmed photoresistors of claim 8 wherein the blocked out portion comprises a portion of a photoactive area of the photoresistor overlayed with a light inhibiting substance.

10. The trimmed photoresistors of claim 9 wherein the light inhibiting substance comprises ink.

11. The trimmed photoresistors of claim 10 wherein the portion overlayed with ink comprises lines of ink.

12. The trimmed photoresistor of claim 10 wherein the overlayed ink comprises ink applied by spraying.

13. The trimmed photoresistors of claim 8 wherein the predetermined tolerance is less than one half of the untrimmed parts tolerance for the photoresistors.

14. The trimmed photoresistors of claim 8 wherein the predetermined tolerance is less than one tenth of the untrimmed parts tolerance for the photoresistors.

* * * * *